(12) United States Patent
Mori

(10) Patent No.: US 7,196,437 B2
(45) Date of Patent: Mar. 27, 2007

(54) CONTRACTION TYPE ACTUATOR

(75) Inventor: Teruo Mori, Tokyo (JP)

(73) Assignee: TDK Corporation, Tokyo (JP)

( * ) Notice: Subject to any disclaimer, the term of this patent is extended or adjusted under 35 U.S.C. 154(b) by 26 days.

(21) Appl. No.: 10/536,309

(22) PCT Filed: Feb. 25, 2004

(86) PCT No.: PCT/JP2004/002232

§ 371 (c)(1),
(2), (4) Date: May 26, 2005

(87) PCT Pub. No.: WO2004/077582

PCT Pub. Date: Sep. 10, 2004

(65) Prior Publication Data

US 2006/0091738 A1    May 4, 2006

(30) Foreign Application Priority Data

Feb. 28, 2003  (JP) ............................ 2003-053632

(51) Int. Cl.
*H01L 41/06* (2006.01)
(52) U.S. Cl. ...................................................... 310/26
(58) Field of Classification Search .................. 310/26
See application file for complete search history.

(56) References Cited

U.S. PATENT DOCUMENTS 5,184,037 A * 2/1993 Kobayashi et al. ............ 310/26
5,357,232 A * 10/1994 Suzuki et al. ................ 335/215
5,406,153 A * 4/1995 Flatau et al. ................... 310/26
5,451,821 A * 9/1995 Teter et al. ..................... 310/26

FOREIGN PATENT DOCUMENTS

| JP | 05060059 A | * | 3/1993 |
| JP | 05167127 A | * | 7/1993 |
| JP | A 06-086575 | | 3/1994 |
| JP | 09083037 A | * | 3/1997 |
| JP | A 09-075847 | | 3/1997 |
| JP | A 11-022587 | | 1/1999 |

* cited by examiner

*Primary Examiner*—Burton Mullins
(74) *Attorney, Agent, or Firm*—Oliff & Berridge, PLC

(57) ABSTRACT

A contraction type actuator 10 is provided which can efficiently and evenly apply a bias magnetic field to a magnetostrictive rod to obtain a large contraction amount, while having a small and simple structure.

In the contraction type actuator 10, a giant magnetostrictive rod 12 flexibly expands and contracts by controlling the strength of a magnetic field applied by a magnet coil 14. A bias magnet comprises a first bias magnet 16 and a second bias magnet 18. The fist bias magnet 16 in an approximately cylindrical shape is coaxially disposed around the giant magnetostrictive rod 12. The second bias magnet 18 is disposed in the inner space 16A of the first bias magnet 16, and is polarized in the direction of drawing a part of a magnetic field generated by the first bias magnet 16 into the inner space 16A.

27 Claims, 4 Drawing Sheets

CONTRACTION TYPE ACTUATOR

BACKGROUND

1. Technical Field

The present invention relates to a contraction type actuator in which a magnetostrictive rod contracts in an axial direction by applying a magnetic field to the magnetostrictive rod. In particular, the present invention relates to a contraction type actuator which can efficiently and evenly apply a bias magnetic field to the magnetostrictive rod to obtain a large contraction amount, while having a small and simple structure.

2. Background Art

Conventionally, an actuator which utilizes the characteristic of a magnetostrictive element in which applying a magnetic field distorts a magnetic material is widely known. In this magnetostrictive element, a magnetostrictive member can expand and contract by controlling the strength of a magnetic field applied to the magnetostrictive member. The actuator using such a magnetostrictive element is widely applied to the field of precision equipment, a fuel injection valve of an automobile, and the like.

For example, Japanese Patent Laid-Open Publication No. Hei 11-22587 discloses a contraction type actuator. In the contraction type actuator, a cylindrical magnetostrictive rod is expanded in advance by applying a bias magnetic field to the magnetostrictive rod, and then the magnetostrictive rod contracts (carries out contraction operation) by applying a magnetic field in the opposite direction of the bias magnetic field thereto by means of a solenoid.

By the way, a magnetostrictive rod applied to such a contraction type actuator generally takes the shape of a slim cylinder in order to increase a contraction amount (displacement amount), miniaturize the contraction type actuator, prevent the occurrence of a diamagnetic field due to its shape, and the like. This cylindrical magnetostrictive rod is disposed in the inner space of a bias magnet in an approximately cylindrical shape, to apply a bias magnetic field in a certain direction to the magnetostrictive rod.

In the conventionally disclosed contraction type actuator, however, since the bias magnet has the approximately cylindrical shape, a bias magnetic field applied (emitted) to the outer space of the bias magnet is stronger than the bias magnetic field applied to the inner space, in which the magnetostrictive rod is disposed. Thus, there was a problem that the bias magnetic field could not be efficiently applied to the magnetostrictive rod.

Since the magnetostrictive rod, to which the bias magnetic field is applied, takes the shape of a slim cylinder, the vicinity of the center of the cylinder in an axial direction is far from a magnetic pole of the bias magnet. As a result, the strength of the bias magnetic field in the vicinity of the center in the axial direction is weaker than those in the vicinity of both ends in the axial direction. Thus, there was a problem that the strength of the applied bias magnetic field varied in accordance with the axial position of the magnetostrictive rod. Furthermore, such problems became obvious with increasing the length of an axis of the magnetostrictive rod to increase the contraction amount.

DISCLOSURE OF THE INVENTION

To solve such problems, an object of the present invention is to provide a contraction type actuator which can efficiently and evenly apply a bias magnetic field to a magnetostrictive rod to obtain a large contraction amount, while having a small and simple structure.

The inventor of the present invention has found out means for efficiently applying a bias magnetic field to a magnetostrictive rod as a result of study.

In other words, the following present invention can achieve the object.

The contraction type actuator comprises a magnetostrictive rod composed of a magnetostrictive member, an end of the magnetostrictive rod being fixed; a bias magnet for applying a bias magnetic field to the magnetostrictive rod; and a magnet coil for applying a magnetic field in a direction of canceling the bias magnetic field, the magnetostrictive rod flexibly expanding and contracting by controlling strength of the magnetic field applied by the magnet coil, wherein the bias magnet comprises: a first bias magnet in the shape of an approximately cylinder, the first bias magnet being coaxially disposed around the magnetostrictive rod; and a second bias magnet disposed in an inner space of the first bias magnet, the second bias magnet being polarized in the direction of drawing a part of a magnetic field generated by the first bias magnet into the inner space.

The second bias magnet of the contraction type actuator is attached in an axial direction of the magnetostrictive rod.

The second bias magnet of the contraction type actuator is disposed adjacently to the fixed end of the magnetostrictive rod.

The magnetostrictive rod of the contraction type actuator is divided in the vicinity of the middle in the axial direction, and the second bias magnet connects the magnetostrictive rod in the axial direction.

The magnetostrictive rod of the contraction type actuator is formed into the shape of an approximately cylinder, and the second bias magnet is disposed in an inner space of the magnetostrictive rod.

An axial length of the second bias magnet of the contraction type actuator magnet is shorter than an axial length of the magnetostrictive rod in the shape of the approximately cylinder.

The contraction type actuator further comprises a preload member for applying a compression preload to the magnetostrictive rod in the axial direction thereof.

The contraction type actuator further comprises a magnetic yoke made of a magnetic material, the one end of the magnetostrictive rod being fixed on the magnetic yoke, and the magnetic yoke making contact with an axial end of the first bias magnet in the shape of the approximately cylinder.

The contraction type actuator further comprises a transmission rod made of a magnetic material, the transmission rod being coupled to a free end opposite to the fixed end of the magnetostrictive rod in order to transmit the displacement of the magnetostrictive rod to the outside, and the transmission rod being disposed in the vicinity of an axial end of the first bias magnet in the shape of the approximately cylinder.

The contraction type actuator further comprises wherein the magnetostrictive rod is composed of a magnetostrictive member made of a magnetostrictive element.

BEST MODE FOR CARRYING OUT THE INVENTION

Exemplary embodiments of the present invention will be hereinafter described with reference to the drawings.

Figure 1:
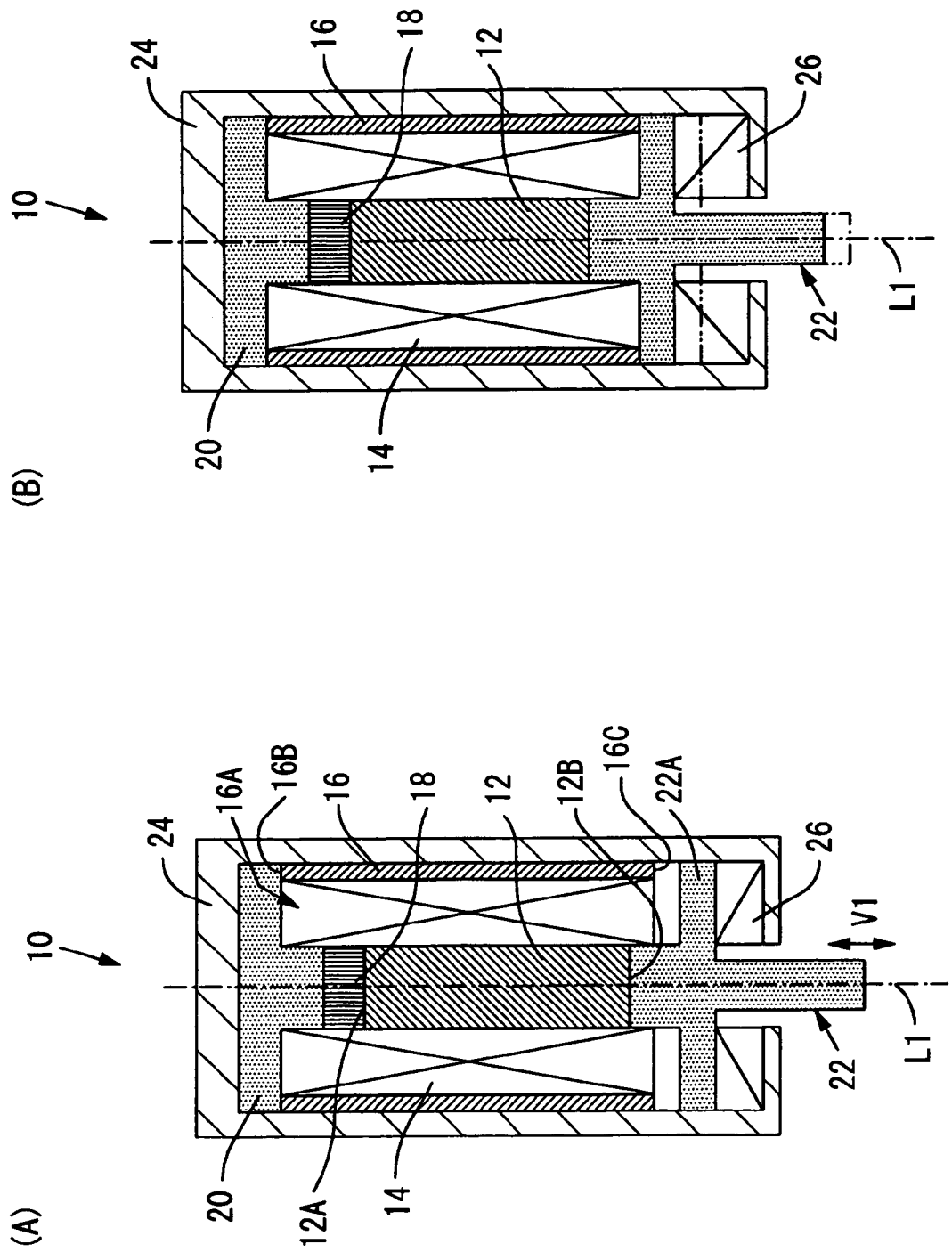
FIGS. 1A and 1B are side sectional views which schematically show a contraction type actuator according to an exemplary embodiment of the present invention.

FIG. 1 schematically shows side sections of a contraction type actuator (hereinafter simply called actuator) 10 according to an exemplary embodiment of the present invention. FIGS. 1A and 1B show states in which a magnetostrictive rod 12 of the contraction type actuator 10 expands and contracts, respectively.

This actuator 10 comprises a magnetostrictive rod 12, a magnet coil 14, first and second bias magnets 16 and 18, a magnetic yoke 20, and a transmission rod 22. They are contained in a main body case 24 in an approximately cylindrical shape. In this actuator 10, the magnetostrictive rod 12 can expand and contract in a V1 direction of the drawing by controlling the strength of a magnetic field applied by the magnet coil 14. "Contraction operation" in which the magnetostrictive rod 12 is brought from an expansion state shown in FIG. 1A into a contraction state shown in FIG. 1B can be carried out (described later).

The first bias magnet 16 comprising a member in an approximately cylindrical shape is disposed inside the main body case 24 coaxially with the main body case 24 (in up and down directions of the drawing).

The magnet coil 14 in an approximately cylindrical shape is disposed in the inner space 16A of the first bias magnet 16 coaxially with the first bias magnet 16.

Furthermore, the magnetostrictive rod 12 comprising a member in an approximately cylindrical shape and the second bias magnet 18 are disposed in the inner space of the magnet coil 14 continuously in an axial direction and coaxially with the magnet coil 14.

The second magnet 18 comprises a member in the shape of an approximately cylinder the diameter of which is the same as that of the magnetostrictive rod 12, and the axial length of which is shorter than that of the magnetostrictive rod 12. The second bias magnet 18 is disposed adjacently to a fixed end 12A of the magnetostrictive rod 12 being an upper end thereof in FIG. 1.

The magnetostrictive rod 12 comprises the magnetostrictive member in an approximately cylindrical shape which is made of a magnetostrictive element. The "magnetostrictive element" refers to a magnetostrictive element made of a powder sintered metal or a single crystal alloy the main ingredient of which is a rare earth element, a specific transition metal and/or the like (for example, terbium, dysprosium, iron, and the like). The "magnetostrictive element" has the property of being largely displaced, when a magnetic field is applied from the outside.

The first bias magnet 16 applies a bias magnetic field in the direction of an axis L1 to the magnetostrictive rod 12. The second bias magnet 18 is polarized in the direction of drawing a part of the bias magnetic field generated by the first bias magnet 16 into the inner space 16A.

The magnet coil 14 can apply a magnetic field in the direction of canceling the bias magnetic field applied by these first and second bias magnets 16 and 18.

The magnetic yoke 20 comprises a magnetic material member disposed in the main body case 24. The magnetic yoke 20 is disposed so as to make contact with an opening of one axial end 16B of the first bias magnet 16 in the approximately cylindrical shape for the purpose of closing the opening. The magnetostrictive rod 12 is fixed on the bottom face of the center of the magnetic yoke 20 in FIG. 1 through the second bias magnet 18.

As a result of the above, the magnetostrictive rod 12, the second bias magnet 18, the magnetic yoke 20, and the first bias magnet 16 form a magnetic circuit, and the bias magnetic field is efficiently led into the magnetostrictive rod 12.

The transmission rod 22 is movable forward and backward in the up and down directions of the drawing. The transmission rod 22 comprises a rod-shaped magnetic material member which is coupled to a free end 12B opposite to the fixed end 12A of the magnetostrictive rod 12 in order to transmit the displacement of the magnetostrictive rod 12 to the outside. The transmission rod 22 has a brim section 22A in the middle of the magnetic material member in the axial direction. The brim section 22A has the shape of a disk the diameter of which is slightly smaller than the internal diameter of the main body case 24. The outer periphery of the brim section 22A is positioned in the vicinity of the other axial end 16C of the first bias magnet 16.

As a result of the above, the magnetostrictive rod 12, the transmission rod 22 (including the brim section 22A), and the first bias magnet 16 form a magnetic circuit, and the bias magnetic field is efficiently led into the magnetostrictive rod 12.

A prestressed spring 26 is disposed between the bottom side face of the brim section 22A of the transmission rod 22 in FIG. 1 and the inner end face of the main body case 24 in a contracting manner. The prestressed spring 26 applies a compression preload to the magnetostrictive rod 12 in the direction of the axis L1 through the transmission rod 22, so that the magnetostrictive fluctuation range of the magnetostrictive rod 12 is optimized.

Figure 2:
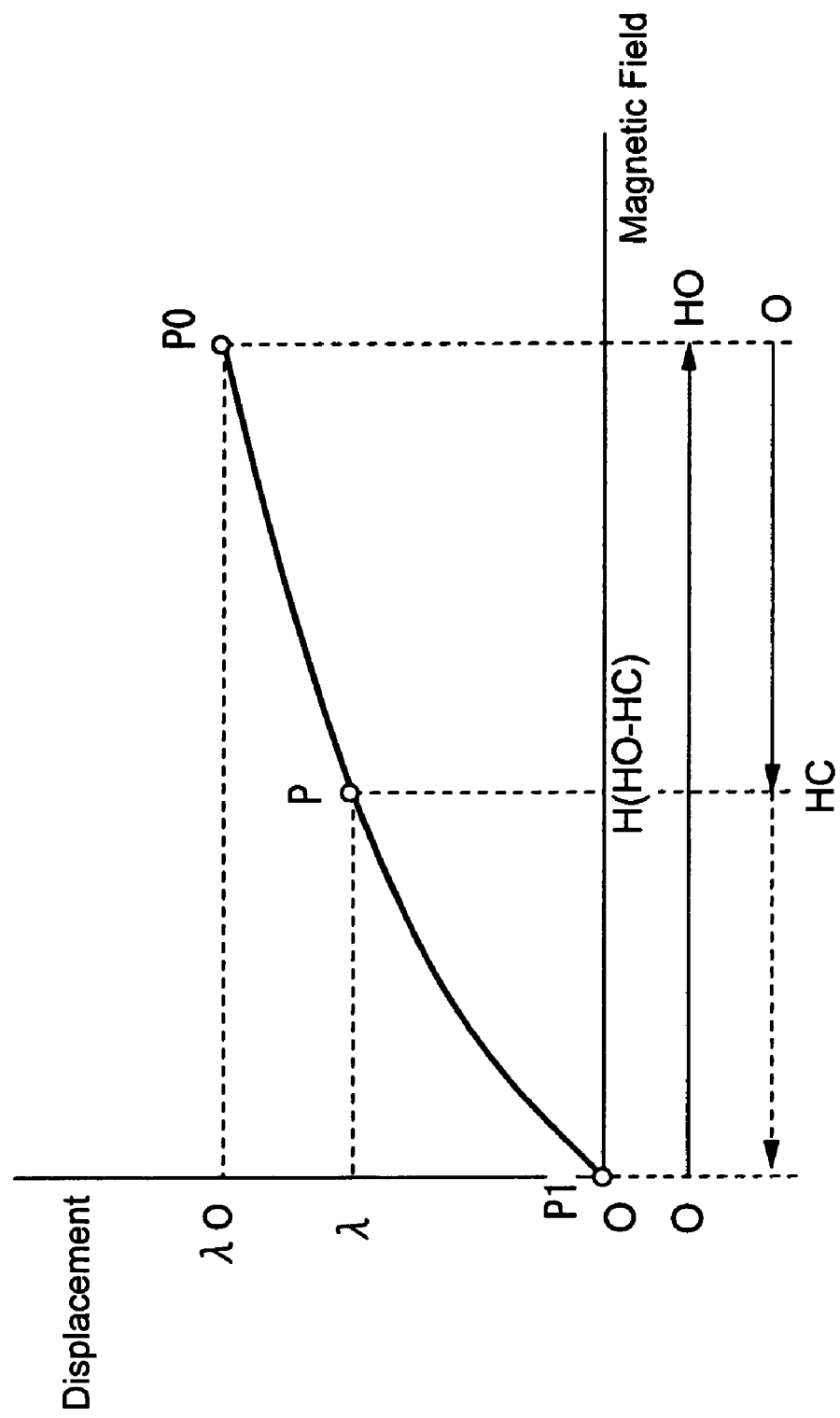
FIG. 2 is a graph which shows the relation between a magnetic field applied to a magnetostrictive rod of the contraction type actuator of FIG. 1 and the displacement of the magnetostrictive rod.

Next, the operation of the actuator 10 according to the exemplary embodiment of the present invention will be described with reference to FIG. 2. FIG. 2 shows the relation between the magnetic field applied to the magnetostrictive rod 12 of the actuator 10 (horizontal axis) and the displacement of the magnetostrictive rod 12 (vertical axis).

When the magnet coil 14 is not energized (point P0 in FIG. 2), a coil magnetic field HC by the magnet coil 14 is not applied to the magnetostrictive rod 12 (HC=0), so that only a bias magnetic field H0 by the first and second bias magnets 16 and 18 is applied thereto. As a result, an initial displacement $\lambda 0$ by the bias magnetic field H0 occurs in the magnetostrictive rod 12. Therefore, the magnetostrictive rod 12 of the actuator 10 is in the state of expanding in the direction of the axis L1 as shown in FIG. 1A.

When the magnet coil 14 is energized (point P in FIG. 2), on the other hand, the coil magnetic field HC by the magnet coil 14 functions in the direction of canceling the bias magnetic field H0. Thus, a composed magnetic field H (=H0−HC) of the coil magnetic field HC and the bias magnetic field H0 is applied to the magnetostrictive rod 12. In other words, the larger the applied coil magnetic field HC, the smaller the composed magnetic field H applied to the magnetostrictive rod 12 gradually becomes. As a result, the displacement $\lambda$ of the magnetostrictive rod 12 becomes smaller than the initial displacement λ0, and hence the "contraction operation" of the actuator 10 is carried out. Then, the strength of the coil magnetic field HC finally becomes equal to that of the bias magnetic field H0 (HC=H0), and the composed magnetic field H becomes approximately zero (point P1 in FIG. 2). Thus, the magnetostrictive rod 12 of the actuator 10 comes into the state of contracting in the direction of the axis L1 as shown in FIG. 1B.

As described above, the magnetostrictive rod 12 of the actuator 10 flexibly expands and contracts by controlling the strength of the coil magnetic field HC applied by the magnet coil 14.

According to the actuator 10 of the exemplary embodiment of the present invention, a bias magnet comprises the first bias magnet 16 and the second bias magnet 18. The first bias magnet 16 in the approximately cylindrical shape is coaxially disposed around the magnetostrictive rod 12. The second bias magnet 18 is disposed in the inner space 16A of the first bias magnet 16, and is polarized in the direction of drawing a part of the magnetic field generated by the first bias magnet 16 into the inner space 16A. Accordingly, it is possible to draw the part of the bias magnetic field generated by the first bias magnet 16 into the inner space 16A of the first bias magnet 16, that is, into the direction of the magnetostrictive rod 12. Therefore, it is possible to efficiently apply the bias magnetic field by a synergistic effect between the first and second bias magnets 16 and 18, and hence to increase the bias magnetic field applied to the magnetostrictive rod 12. As a result, increase in the contraction amount of the contraction type actuator 10 is realized.

Since the second bias magnet 18 is attached in the direction of the axis L1 of the magnetostrictive rod 12, it is possible to further effectively apply the bias magnetic field to the magnetostrictive rod 12, and also realize the miniaturization of the actuator 10. Furthermore, since the second bias magnet 18 is disposed adjacently to the fixed end 12A of the magnetostrictive rod 12, the second bias magnet 18 is disposed oppositely to the expanding direction of the magnetostrictive rod 12. Thus, it is possible to stabilize the displacement of the magnetostrictive rod 12.

Furthermore, the prestressed spring 26 applies the compression preload to the direction of the axis L1 of the magnetostrictive rod 12, so that the contraction amount, speed, and power of the magnetostrictive rod 12 in canceling the bias magnetic field is increased. Therefore, it is possible to increase the efficiency of the actuator 10.

Since the giant magnetostrictive rod 12 of the actuator 10 is made of the giant magnetostrictive element, it is possible to obtain a magnetostrictive displacement amount (contraction amount) which is twice or more as large as that of a conventional piezoelectric element, and is fifty times or more as large as that of a conventional magnetostrictive element.

In the exemplary embodiment, the magnetostrictive rod 12 comprises the magnetostrictive member made of the magnetostrictive element, but the present invention is not limited to this. A magnetostrictive member made of a magnetostrictive element may be used instead.

In the exemplary embodiment, the second bias magnet 18 is disposed adjacently to the fixed end 12A of the magnetostrictive rod 12, but the present invention is not limited to this. The position, number, and the like of the second bias magnet 18 according to the present invention are not especially limited, as long as the second bias magnet 18 is disposed in the inner space 16A of the first bias magnet 16.

Figure 3:
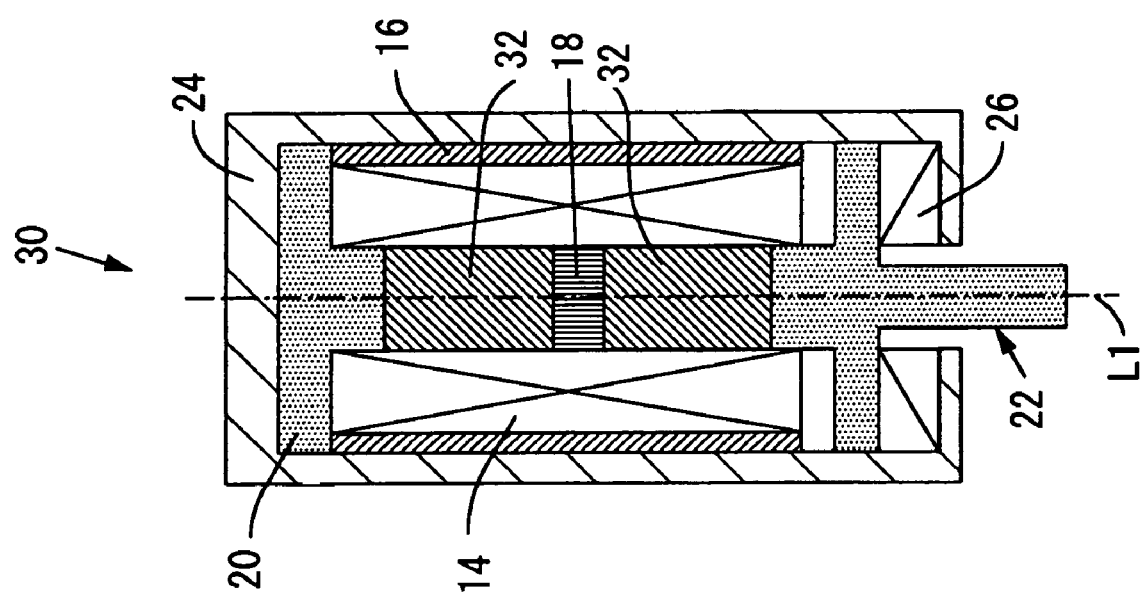
FIG. 3 is a side sectional view which schematically shows a contraction type actuator according to another exemplary embodiment of the present invention.

Accordingly, for example, like an actuator 30 shown in FIG. 3, a magnetostrictive rod 32 may be divided in the vicinity of the middle in the direction of an axis L1, and the second bias magnet 18 may connect the magnetostrictive rod 32 in the direction of the axis L1. When the second bias magnet 18 is disposed in the vicinity of the middle of the magnetostrictive rod 32 in the direction of the axis L1 like this, it is possible to further even the bias magnetic field applied to the magnetostrictive rod 32.

Figure 4:
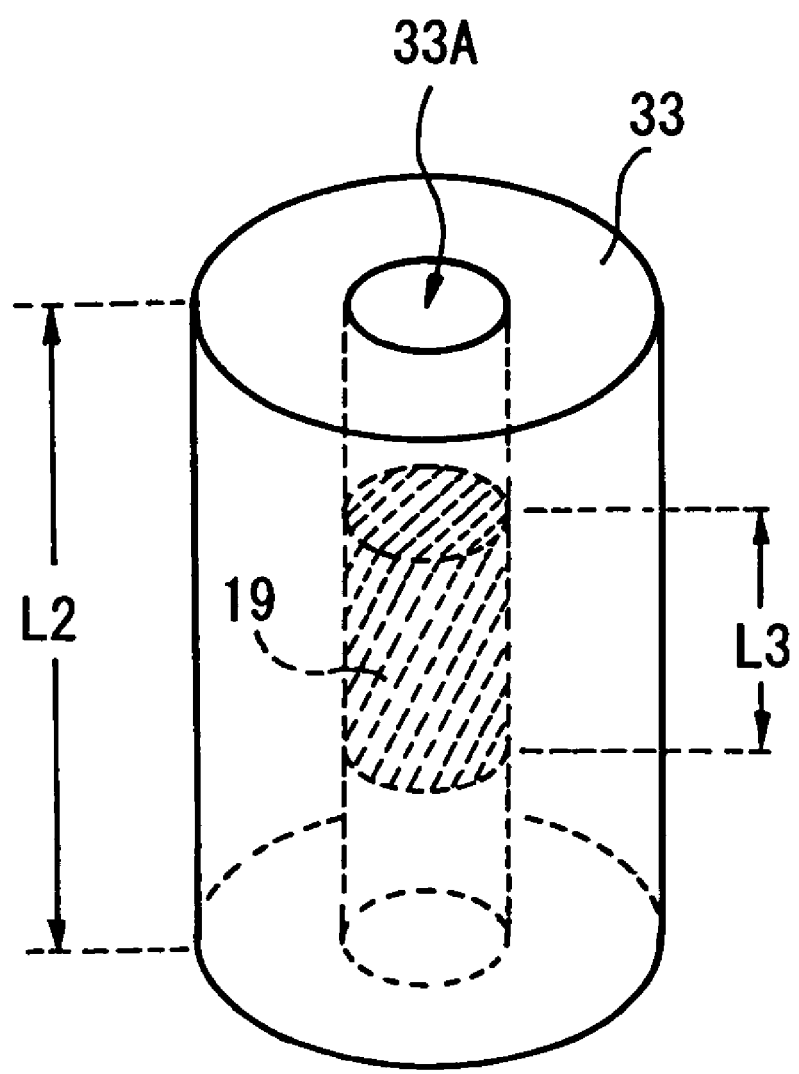
FIG. 4 is a side sectional view which schematically shows a magnetostrictive rod according to further another exemplary embodiment of the present invention.

Otherwise, as shown in FIG. 4, a magnetostrictive rod 33 may be formed into an approximately cylindrical shape, and a second bias magnet 19 may be disposed in the inner space 33A of the magnetostrictive rod 33. According to such a structure, it is possible to prevent an axial stress occurring in the expansion and contraction of the magnetostrictive rod 33 from being applied to the second bias magnet 19. In this case, it is preferable that the axial length L3 of the second bias magnet 19 be shorter than the axial length L2 of the magnetostrictive rod 33 in the approximately cylindrical shape.

INDUSTRIAL APPLICABILITY

A contraction type actuator according to the present invention has the superior function of efficiently and evenly applying a bias magnetic field to a magnetostrictive rod to obtain a large contraction amount, while having small and simple structure.

The invention claimed is:

1. A contraction type actuator comprising:
  a magnetostrictive rod composed of a magnetostrictive member, an end of the magnetostrictive rod being fixed;
  a bias magnet for applying a bias magnetic field to the magnetostrictive rod; and
  a magnet coil for applying a magnetic field in a direction that cancels the bias magnetic field, the magnetostrictive rod flexibly expanding and contracting by controlling strength of the magnetic field applied by the magnet coil,
  wherein the bias magnet comprises:
    a first bias magnet in the shape of a cylinder, the first bias magnet being coaxially disposed around the magnetostrictive rod;
    a second bias magnet disposed in an inner space of the first bias magnet, attached in an axial direction of the magnetostrictive rod and separated from the rod, the second bias magnet is magnetized axially so that its magnetic field adds to or draws a part of the first bias magnetic field into the space inside the cylindrical first bias magnet; and
    a total axial length of the magnetostrictive rod and the second bias magnet is shorter than an axial length of the first bias magnet.

2. The contraction type actuator according to claim 1, wherein
  the second bias magnet is disposed adjacent to the fixed end of the magnetostrictive rod.

3. The contraction type actuator according to claim 2, further comprising a preload member for applying a compression preload to the magnetostrictive rod in the axial direction thereof.

4. The contraction type actuator according to claim 2, further comprising a magnetic yoke made of a magnetic material, the one end of the magnetostrictive rod being fixed on the magnetic yoke, and the magnetic yoke making contact with an axial end of the first bias magnet in the shape of a cylinder.

5. The contraction type actuator according to claim 2, further comprising a transmission rod made of a magnetic material, the transmission rod being coupled to a free end opposite to the fixed end of the magnetostrictive rod in order to transmit the displacement of the magnetostrictive rod to the outside of the actuator and the transmission rod being disposed in the vicinity of an axial end of the first bias magnet in the shape of a cylinder.

6. The contraction type actuator according to claim 2, wherein
the magnetostrictive rod is made of a magnetostrictive element wherein the magnetostrictive element is made of a powder sintered metal or a single crystal alloy, wherein the element is composed of any one of the following: a rare earth element, a specific transition metal, terbium, dysprosium and iron.

7. The contraction type actuator according to claim 1, wherein
the magnetostrictive rod is divided in the vicinity of the middle in the axial direction, and the second bias magnet connects the magnetostrictive rod in the axial direction.

8. The contraction type actuator according to claim 7, further comprising a preload member for applying a compression preload to the magnetostrictive rod in the axial direction thereof.

9. The contraction type actuator according to claim 7, further comprising a magnetic yoke made of a magnetic material, the one end of the magnetostrictive rod being fixed on the magnetic yoke, and the magnetic yoke making contact with an axial end of the first bias magnet in the shape of a cylinder.

10. The contraction type actuator according to claim 7, further comprising a transmission rod made of a magnetic material, the transmission rod being coupled to a free end opposite to the fixed end of the magnetostrictive rod in order to transmit the displacement of the magnetostrictive rod to the outside of the actuator, and the transmission rod being disposed in the vicinity of an axial end of the first bias magnet in the shape of a cylinder.

11. The contraction type actuator according to claim 7, wherein
the magnetostrictive rod is made of a magnetostrictive element wherein the magnetostrictive element is made of a powder sintered metal or a single crystal alloy, wherein the element is composed of any one of the following: a rare earth element, a specific transition metal, terbium, dysprosium and iron.

12. The contraction type actuator according to claim 1, wherein
the magnetostrictive rod is formed into the shape of a cylinder, and the second bias magnet is disposed in an inner space of the magnetostrictive rod.

13. The contraction type actuator according to claim 12, wherein
an axial length of the second bias magnet is shorter than an axial length of the magnetostrictive rod in the shape of a cylinder.

14. The contraction type actuator according to claim 13, further comprising a preload member for applying a compression preload to the magnetostrictive rod in the axial direction thereof.

15. The contraction type actuator according to claim 13, further comprising a magnetic yoke made of a magnetic material, the one end of the magnetostrictive rod being fixed on the magnetic yoke, and the magnetic yoke making contact with an axial end of the first bias magnet in the shape of a cylinder.

16. The contraction type actuator according to claim 13, further comprising a transmission rod made of a magnetic material, the transmission rod being coupled to a free end opposite to the fixed end of the magnetostrictive rod in order to transmit the displacement of the magnetostrictive rod to the outside of the actuator and the transmission rod being disposed in the vicinity of an axial end of the first bias magnet in the shape of a cylinder.

17. The contraction type actuator according to claim 13, wherein
the magnetostrictive rod is made of a magnetostrictive element wherein the magnetostrictive element is made of a powder sintered metal or a single crystal alloy, wherein the element is composed of any one of the following: a rare earth element, a specific transition metal, terbium, dysprosium and iron.

18. The contraction type actuator according to claim 1, further comprising a preload member for applying a compression preload to the magnetostrictive rod in the axial direction thereof.

19. The contraction type actuator according to claim 18, further comprising a magnetic yoke made of a magnetic material, the one end of the magnetostrictive rod being fixed on the magnetic yoke, and the magnetic yoke making contact with an axial end of the first bias magnet in the shape of a cylinder.

20. The contraction type actuator according to claim 18, further comprising a transmission rod made of a magnetic material, the transmission rod being coupled to a free end opposite to the fixed end of the magnetostrictive rod in order to transmit the displacement of the magnetostrictive rod to the outside of the actuator, and the transmission rod being disposed in the vicinity of an axial end of the first bias magnet in the shape of a cylinder.

21. The contraction type actuator according to claim 18, wherein
the magnetostrictive rod is made of a magnetostrictive element wherein the magnetostrictive element is made of a powder sintered metal or a single crystal alloy, wherein the element is composed of any one of the following: a rare earth element, a specific transition metal, terbium, dysprosium and iron.

22. The contraction type actuator according to claim 1, further comprising a magnetic yoke made of a magnetic material, the one end of the magnetostrictive rod being fixed on the magnetic yoke, and the magnetic yoke making contact with an axial end of the first bias magnet in the shape of a cylinder.

23. The contraction type actuator according to claim 22, further comprising a transmission rod made of a magnetic material, the transmission rod being coupled to a free end opposite to the fixed end of the magnetostrictive rod in order to transmit the displacement of the magnetostrictive rod to the outside of the actuator, and the transmission rod being disposed in the vicinity of an axial end of the first bias magnet in the shape of a cylinder.

24. The contraction type actuator according to claim 22, wherein
the magnetostrictive rod is made of a magnetostrictive element wherein the magnetostrictive element is made of a powder sintered metal or a single crystal alloy, wherein the element is composed of any one of the following: a rare earth element, a specific transition metal, terbium, dysprosium and iron.

25. The contraction type actuator according to claim 1, further comprising a transmission rod made of a magnetic material, the transmission rod being coupled to a free end opposite to the fixed end of the magnetostrictive rod in order to transmit the displacement of the magnetostrictive rod to the outside of the actuator, and the transmission rod being disposed in the vicinity of an axial end of the first bias magnet in the shape of a cylinder.

26. The contraction type actuator according to claim 25, wherein
the magnetostrictive rod is made of a magnetostrictive element wherein the magnetostrictive element is made of a powder sintered metal or a single crystal alloy, wherein the element is composed of any one of the following: a rare earth element, a specific transition metal, terbium, dysprosium and iron.

27. The contraction type actuator according to claim 1, wherein
the magnetostrictive rod is made of a magnetostrictive element wherein the magnetostrictive element is made of a powder sintered metal or a single crystal alloy, wherein the element is composed of any one of the following: a rare earth element, a specific transition metal, terbium, dysprosium and iron.

* * * * *